United States Patent [19]

Hansen et al.

[11] Patent Number: 5,445,679
[45] Date of Patent: Aug. 29, 1995

[54] CLEANING OF POLYCRYSTALLINE SILICON FOR CHARGING INTO A CZOCHRALSKI GROWING PROCESS

[75] Inventors: Richard L. Hansen; Mohsen Banan, both of St. Louis, Mo.

[73] Assignee: MEMC Electronic Materials, Inc., St. Peters, Mo.

[21] Appl. No.: 996,037

[22] Filed: Dec. 23, 1992

[51] Int. Cl.$^6$ .............................................. B08B 7/00
[52] U.S. Cl. .............................. 134/1; 134/2; 134/21; 134/1.1
[58] Field of Search ............ 134/1, 2, 21; 117/13, 117/931, 932, 92, 58; 156/643

[56] References Cited

U.S. PATENT DOCUMENTS

| | | | |
|---|---|---|---|
| 4,292,093 | 9/1981 | Ownby et al. | 148/4 |
| 4,298,423 | 11/1981 | Lindmayer | 156/616 |
| 4,388,286 | 6/1983 | Kapur et al. | 423/348 |
| 4,400,232 | 8/1983 | Ownby et al. | 156/601 |
| 4,462,806 | 7/1984 | Mahoney et al. | 23/293 |
| 4,525,336 | 6/1985 | Griesshammer et al. | 423/348 |
| 4,555,303 | 11/1985 | Legge et al. | 134/2 |
| 4,680,096 | 7/1987 | Dosaj et al. | 204/164 |
| 4,705,591 | 11/1987 | Carle et al. | 156/617 |
| 4,837,376 | 6/1989 | Schwirtlich et al. | 423/348 |
| 4,983,254 | 1/1991 | Fujimura et al. | 156/643 |

OTHER PUBLICATIONS

Mikata et al., Thermal Cleaning of Silicon Surface in Ultrahigh Vacuum, CA 103(26): 225320, 1985, Kawasaki, Japan Fuji, Manufacture of Field-Effect Transistors, CA 115(20): 221063, 1991, Japan.

*Primary Examiner*—David A. Simmons
*Assistant Examiner*—Sean Vincent
*Attorney, Agent, or Firm*—Senniger, Powers, Leavitt & Roedel

[57] ABSTRACT

A process for cleaning organic contaminants from the surface of polycrystalline silicon. In the process, the surface of the polycrystalline silicon is exposed to an oxidizing medium which directly oxidizes the organic contaminant. The oxidized contaminants are then carried away from the polycrystalline silicon surface.

21 Claims, No Drawings

CLEANING OF POLYCRYSTALLINE SILICON FOR CHARGING INTO A CZOCHRALSKI GROWING PROCESS

SUMMARY OF THE INVENTION

This invention relates, in general, to an improved process for producing a single crystal silicon ingot from polycrystalline silicon by the Czochralski ("CZ") crystal pulling process, and in particular, to a process for cleaning organics that may be chemically bonded, chemisorbed, physisorbed, or mechanically or physically present on the surface of the polycrystalline silicon.

Most single crystal silicon used for microelectronic circuit fabrication is prepared by the CZ process. In this process, polycrystalline silicon is melted in a crucible, a seed crystal is dipped into the molten silicon and then withdrawn to form a neck of the desired dimensions. The pulling rate, melt temperature, atmosphere and eventual cooling rate are controlled in accordance with standard practice to produce a single crystal of desired characteristics.

During the CZ process, carbon is incorporated into the single crystal. One source of carbon is the graphite parts in the CZ process equipment which may react with oxygen sources that are present in the growth ambient. It is conventionally believed, however, that the main source of carbon contamination is the polycrystalline silicon. In addition, it has been assumed that carbon-containing impurities found in trichlorsilane used in the production of the polycrystalline silicon are the main sources for the carbon in the starting material. F. Shimura, *Semiconductor Silicon Crystal Technology*, Academic Press (San Diego Calif., 1989).

As integrated circuit technology advances, the need to impose tighter limits on carbon content in the single crystal silicon used in electronic device fabrication continues to increase. Thus, various changes directed at controlling carbon content have been proposed for the hot zone of the CZ pullers, such as modifications in the hot zone geometry, sizes, shapes and material. Changes have also been proposed in the way processes are conducted, such as reductions in power levels and the flow of argon which carries off reaction products such as SiO and CO. Efforts to control carbon content have also involved examination of the sources of polycrystalline silicon.

None of these proposals, however, have been entirely successful. Among the objects of this invention, therefore, is the provision of a process for reducing the carbon content of single crystal silicon produced by the CZ process.

Polycrystalline silicon used as a starting material in the preparation of single crystal silicon in the CZ process is routinely stored and shipped in containers consisting of an organic composition. For instance, chunk polycrystalline silicon produced by the Siemens method or otherwise (see, e.g., F. Shimura, *Semiconductor Crystal Technology*, Academic Press (1989), (p. 117–121) is routinely stored and shipped in barefoot polyethylene bags, that is, bags formed of polyethylene which is devoid of plasticizers, processing additives such as stearates and other impurities. Surprisingly, it has been discovered that the organic compounds present in these containers may constitute a significant source of carbon contamination. Additionally, vapor phase organics present in the ambient atmosphere may be adsorbed onto the polycrystalline silicon and may constitute an additional source of carbon contamination.

Briefly, therefore, the present invention is directed to a process for cleaning sources of organic carbon from the surface of polycrystalline silicon. The process comprises exposing the surface of the polycrystalline silicon to an oxidizing medium which directly oxidizes sources of organic carbon that are chemically bonded, chemisorbed, or physisorbed to, or physically or mechanically present on the surface of the polycrystalline silicon and carrying the oxidized organic compounds away from the polycrystalline silicon surface.

The present invention is additionally directed to a process for cleaning polycrystalline silicon which has been stored or shipped in a container comprising organic carbon. In the process, the polycrystalline silicon is removed from the container and exposed to an oxidizing medium. Sources of organic carbon chemically bonded, chemisorbed, or physisorbed to, or physically or mechanically present on the surface of the polycrystalline silicon are thus oxidized and carried away from the polycrystalline silicon surface.

Other objects of the invention will be in part apparent and in part pointed out hereinafter.

DETAILED DESCRIPTION OF THE PREFERRED EMBODIMENTS

In accordance with the present invention, the oxidizing medium directly oxidizes organic compounds on the surface of the polycrystalline silicon. The oxidation converts the organic compounds to volatile or gas phase species and breaks any bonds with the surface. No additional steps, such as autoclaving, are required to oxidize the organic compounds and remove them from the surface—exposure to the oxidizing medium, alone, is sufficient.

To remove organic compounds which are in a relatively low oxidation state, such as unhalogenated hydrocarbons, the preferred oxidizing medium is an oxidative plasma formed from a mixture of an inert gas such as helium, neon, argon, krypton, radon or xenon and oxygen. Because removal efficiency is a function of exposure time and oxidative strength of the medium, the concentration of oxygen in the plasma is not narrowly critical. For example, dilute oxygen concentrations (<20% oxygen) may be used provided the exposure time is sufficient to oxidize the organic contaminants.

To remove organic compounds which are in a relatively higher oxidation state such as halogenated hydrocarbons or to reduce the exposure time necessary to oxidize the surface contaminants, oxidative plasmas which are more strongly oxidative may be used. For instance, the oxidative plasma may be formed from pure oxygen, an inert gas, oxygen and a halogen, an inert gas and a halogen, or pure halogen.

The oxidative plasma may be formed by the application of electromagnetic energy to a gas, such methods being well known to those of ordinary skill. For instance, units for microwave induced plasmas are commerically available from Plasmatic Systems (North Brunswick, N.J.), units for RF generator induced plasma are commercially available from Technics, Inc. (Dublin, Calif.), and other commercial sources of plasma etching units and supplies include Lam Research Corp. (Fremont, Calif.) and Applied Science and Technology, Inc (Woburn, Mass.).

The polycrystalline silicon is removed from the container in which it was transported and/or stored and placed into a quartz dish. The dish is placed into the plasma chamber, and the plasma chamber is then closed, sealed, evacuated and purged with the selected gas mix. The flow rate is set so than the chamber pressure is approximately 1–5 mm of Hg. The plasma generator is turned on and the polycrystalline silicon is exposed to the plasma for a period sufficient for the organic contaminants to be oxidized and carried away from the polycrystalline silicon by the flowing gases. The exposure time is not narrowly critical and, as previously indicated, is related to the oxidative strength of the plasma. In general, however, taking into account the degree of organic contamination, the stoichiometric amount of oxidizing agent required for oxidation and the oxidation state of the organic contaminant, exposure periods of several minutes or less are preferred and exposure periods of 10 to 15 seconds are most preferred. In addition, the polycrystalline silicon is preferably rotated or turned-over (depending upon the geometry of the polycrystalline silicon) and exposed to the oxidative plasma as many times as necessary to facilitate thorough cleaning of all surfaces.

For certain cleaning applications, an oxidizing gas may adequately clean organic contaminants from the polycrystalline silicon surface and thus, may constitute the preferred oxidizing medium. For example, a hot (e.g., >233° C.) gaseous mixture of one or more inert gases and oxygen or hot ozone will clean some organics from the surface of polycrystalline silicon. The polycrystalline silicon may be exposed to the gas by flowing the gas over the polycrystalline silicon surface for a period of time sufficient to oxidize and carry the carbon species away from the polycrystalline silicon surface. In general, exposure times on the order of two minutes or less are preferred.

Although they are less preferred because the polycrystalline silicon must be completely dry before it is melted in the CZ process and because of purity concerns, aqueous systems may also be used as the cleaning medium. For instance, bubbling ozone "Pirhana bath" (sulfuric acid+hydrogen peroxide) sulfuric acid+bubbling ozone, sulfuric acid+nitric acid, hydrofluoric acid+hydrogen peroxide, hydrofluoric acid+bubbling ozone may be used to clean some organics from the surface of polycrystalline silicon. The polycrystalline silicon may be sprayed with, submerged in, or otherwise exposed to the liquid for a period of time sufficient to oxidize the carbon and carbon-containing contaminants and carry them away from the surfaces of the polycrystalline silicon. The cleaned polycrystalline silicon is then thoroughly dried by evaporation of the cleaner. For example, polycrystalline chunks may be submerged in a bath of water through which $O_3$ is continuously bubbled for about 2 minutes, removed from the bath and dried.

To eliminate possible recontamination, the cleaned polycrystalline silicon is immediately charged to a Czochralski fused silica crucible of the type commercially available from GE Quartz (Cleveland, Ohio), Toshiba Ceramics America (Hilsboro, Oreg.), and QSI Quartz Scientific Inc (Fairport Harbor, Ohio) with a minimum of handling and storage. In addition, the equipment used to handle and process the cleaned polycrystalline silicon is selected to eliminate exposure to carbon and carbon species. For instance, tongs used to transfer the polycrystalline silicon to the crucible are preferably constructed of silicon or quartz.

Based upon data available to date (see, e.g., Examples 1 and 2), it appears that polycrystalline silicon cleaned with an oxidative plasma is more reactive than uncleaned polycrystalline silicon. That is, polycrystalline silicon that has been cleaned with an oxidative plasma and melted in the hot zone at a slow rate has a significantly lower carbon content than polycrystalline silicon from the same batch which has been similarly cleaned but melted at a faster rate. In fact, for certain runs, polycrystalline silicon that has been cleaned using an oxidative plasma and melted in the hot zone at a high rate have yielded single crystal silicon having carbon contents which are even greater than that of yielded by polycrystalline silicon which is used "as received" from the manufacturer and similarly processed. Without being bound to any theory, it is presently suspected that the plasma cleaning has activated some surface sites for further adsorption.

Upon being charged to the crucible, therefore, the polycrystalline silicon is melted at a rate which has been empirically determined to provide the benefits of cleaning the polycrystalline silicon. That is, the melting rate should be adequate to allow for reasonable throughput for the crystal puller and, in addition, to provide single crystal silicon produced using polycrystalline silicon with reduced carbon content relative to single crystal silicon which has not been cleaned with an oxidizing medium in accordance with the present invention (holding all other process parameters constant). Based upon experimental results to date, the polycrystalline silicon charge should be melted at a rate less than about 14 kg/hr and is preferably melted at a rate less than 12 kg/hr, more preferably at a rate less than 10 kg/hr and most preferably at a rate less than 8 kg/hour. During melting, a gas such as argon is flowed into the crystal puller chamber at a rate of 50–75 standard cubic feet per hour ("scfh") and the pressure within the chamber is maintained within a range of about 10 to about 30 mm of Hg.

Siemens-type, low-carbon polycrystalline silicon having a carbon content of about 0.04 to 0.07 ppma (as reported by the supplier) is presently commercially available. If the polycrystalline silicon bulk were the only source of carbon contamination, the carbon content of single crystal silicon grown by conventional CZ techniques using this low carbon polycrystalline silicon would be about 0.004 ppma at the seed end (10% solidified) and about 0.017 ppma at the opposite end (80% solidified), as determined according to ASTM F123. In reality, however, it is much greater. The carbon content of single crystal silicon grown by conventional CZ techniques without prior cleaning of the low carbon polycrystalline silicon is typically about 0.018–0.025 ppma at the seed end (10% solidified) and about 0.075–0.10 ppma at the opposite end (80% solidified). Significantly, however, single crystal silicon having a carbon content of 0.007 or less at the seed end 10% solidified) and 0.029 ppma or less at the tail end (80% solidified) can be produced using commercially available low carbon polycrystalline silicon, provided the polycrystalline silicon is cleaned of organic contaminants.

Although the present invention is primarily directed to The removal of organic contaminants on the surface of the polycrystalline silicon which originate with containers used for shipping and storage, the process is not so limited. The process can also be used to clean organic contaminants from the polycrystalline surface which are deposited from the atmosphere or during handling of the polycrystalline silicon.

The following examples further illustrate the process of the invention:

EXAMPLES 1-7

Approximately 200 g of Siemens-type polycrystalline silicon chunks having a carbon content of 0.04-0.07 ppma were removed from a barefoot polyethylene bag and placed in a quartz dish which was then placed into a plasma chamber. The plasma chamber was closed, sealed, evacuated and purged with a gas mixture of 80% Ar and 20% $O_2$. A microwave source sold under the trade designation Plasma-Preen by Plasmatic Systems (North Brunswick, N.J.) was directed at the plasma chamber, resulting in formation of a plasma within the chamber. The gas flow rate was selected and maintained such that the chamber pressure was about 1-3mmHg. The plasma was maintained for about 2 minutes before being quenched by discontinuing the microwaves. The chamber was filled with air, opened, and the polycrystalline silicon charge was removed and turned over. The polycrystalline silicon was placed back into the chamber and exposed to plasma for another 2 minutes. The plasma was quenched and the polycrystalline silicon, now cleaned, was removed from the chamber.

A fused silica crucible was loaded with 34 kg plasma-cleaned polycrystalline silicon chunks, covered and placed in a graphite susceptor, situated in a Hamco 3000 CZ crystal puller commercially available from Kayex (Rochester, N.Y.). The puller was closed off and pumped down to 1 mtorr. Argon gas was purged through the puller chamber. The heater was turned on and the power was supplied until the polycrystalline silicon was completely melted down. After the polycrystalline silicon was completely melted, the temperature of the molten polycrystalline silicon was allowed to stabilize for a period of about 30 minutes. A (100) oriented seed was dipped into the melt and crystal growth was initiated. The puller chamber was purged with argon during the growth period of 24 hours. After Completion of the growth period, the power was shut off, the hot zone was allowed to cool down to 100° C., the puller was opened and the crystal was removed for analysis.

This process was repeated seven times under varied conditions resulting in samples 186, 190, 187, 188, 175, 177 and 178 as reported in Table 1.

EXAMPLES 8-13

A fused silica crucible was loaded with 34 kg polycrystalline silicon chunk having a carbon content of 0.04-0.07 ppma taken directly from a barefoot polyethylene bag; the polycrystalline silicon was not cleaned prior to being charged to the crucible. The crucible was placed in a graphite susceptor, situated in a Hamco 3000 Cz crystal puller. The puller was closed off and pumped down to 1 mtorr. Argon gas was purged through the puller chamber. The heater was turned on and the power supplied until the polycrystalline silicon was completely melted down. After being completely melted, the temperature of the molten polycrystalline silicon was allowed to stabilize for a period of about 30 minutes. A (100) oriented seed was dipped into the melt and crystal growth was initiated. The puller chamber was purged with argon during the growth period of 24 hours. After completion of the growth period, the power was shut off, the hot zone was allowed to cool down to 100° C., the puller was opened and the crystal was removed for analysis.

This process was repeated six times under varied conditions to produce crystals 162, 172, 160, 173, 164 and 185 as reported in Table 2.

A slug was removed from the opposite end of each single crystal ingot of Examples 1-13 at a location corresponding to between 0.79 and 0.81 fraction of total charge weight solidified. The carbon content of each of these slugs was determined using fourier transform infrared spectrascopy (FTIR). The carbon content of each slug was measured three times and average values were calculated. The average value for the sample slug of each ingot is reported in Tables 1 and 2 as opposite end carbon (ppma).

The opposite end carbon values were used to estimate the initial carbon content in the melt using the segregation equation for a complete-mix melt, as provided in W. G. Pfann, *Zone Melting*, 2nd ed., (John Wiley and Sons, New York, N.Y. 1966), and as follows:

$$C_S = C_0 k (1-g)^{(k-1)}$$

where $C_S$ is the carbon content as measured by FTIR, g is location of the measured sample in terms of fraction solidified, $C_0$ is the initial carbon content in the melt, and k is the equilibrium distribution coefficient assumed to be 0.089 for carbon in silicon melt growth. The calculated initial carbon content ($C_0$) for the melt from which each numbered ingot of Examples 1-13 is reported in Tables 1 and 2.

TABLE 1

| CLEANED POLCRYSTALLINE SILICON | | | | |
| --- | --- | --- | --- | --- |
| Sample # | Purge rate (scfh) | Melting rate (kgs/hr) | Opposite End Carbon (ppma) | Initial Carbon (ppma) |
| 186 | 50 | 5 | 0.022 | 0.049 |
| 190 | 50 | 6.8 | 0.037 | 0.083 |
| 187 | 75 | 6.8 | 0.025 | 0.056 |
| 188 | 50 | 14.8 | 0.099 | 0.21 |
| 175 | 75 | 16.2 | 0.087 | 0.20 |
| 177 | 50 | 16.2 | 0.071 | 0.15 |
| 178 | 75 | 15.5 | 0.081 | 0.17 |

TABLE 2

| AS-IS POLYCRYSTALLINE SILICON | | | | |
| --- | --- | --- | --- | --- |
| Sample # | Purge rate (scfh) | Melting rate (kgs/hr) | Opposite End Carbon (ppma) | Initial Carbon (ppma) |
| 162 | 50 | 6.1 | 0.065 | 0.13 |
| 172 | 50 | 6.2 | 0.048 | 0.11 |
| 164 | 75 | 5 | 0.076 | 0.175 |
| 160 | 50 | 13.6 | 0.072 | 0.16 |
| 173 | 50 | 13.6 | 0.064 | 0.15 |
| 185 | 75 | 13.1 | 0.05 | 0.11 |

Samples 186, 190 and 187, which represent single crystal ingots prepared from plasma-cleaned polycrystalline silicon subjected to the controlled melt down of this invention, exhibited the lowest carbon content of the ingots evaluated. Samples 182, 175, 177 and 178, which were prepared from the most quickly melted silicon of all the samples evaluated, exhibited the highest carbon content.

Although specific examples of the present invention and its application are set forth it is not intended that they are exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use.

We claim:

1. A process for cleaning polycrystalline silicon which has been stored or shipped in a container comprising an organic compound, comprising:

removing the polycrystalline silicon from the container, exposing the polycrystalline silicon which has been removed from the container to an oxidizing medium to oxidize organic compounds which are on the surface of the polycrystalline silicon, and carrying the oxidized compounds away from the polycrystalline silicon surface.

2. A process as set forth in claim 1 wherein the oxidizing medium is an oxidizing plasma, an oxidizing gas or an oxidizing liquid.

3. A process as set forth in claim 1 wherein the oxidizing medium is an oxidizing plasma.

4. A process as set forth in claim 3 wherein the oxidizing medium is an oxidizing plasma selected from the group consisting of plasmas formed from a mixture of an inert gas and oxygen; pure oxygen; an inert gas, oxygen and a halogen; an inert gas and a halogen; and pure halogen.

5. A process as set forth in claim 1 wherein the oxidizing medium is a microwave induced oxidizing plasma.

6. A process as set forth in claim 1 wherein the oxidizing medium is a microwave induced oxidizing plasma formed from pure oxygen, a mixture of an inert gas and oxygen, a mixture of an inert gas, oxygen and a halogen, a mixture of an inert gas and a halogen, and pure halogen.

7. A process as set forth in claim 1 wherein the polycrystalline silicon is oxidized in a plasma chamber, the oxidizing medium is a microwave induced oxidizing plasma and the chamber is at a pressure of about 1–3 mm Hg as the polycrystalline silicon is exposed to the oxidizing medium.

8. The process of claim 1 wherein the container is a polyethylene bag.

9. A process for preparing a mass of molten silicon for use in the Czochralski process from polycrystalline silicon which has been stored or shipped in a container comprising an organic compound, comprising:

removing the polycrystalline silicon from the container, cleaning the polycrystalline silicon which has been removed from the container by exposing it to an oxidizing medium which directly oxidizes organic compounds which are on the surface of the polycrystalline silicon and carrying the oxidized compounds away from the surface of the polycrystalline silicon, charging the cleaned polycrystalline silicon to a crucible, and melting the charged polycrystalline silicon.

10. A process as set forth in claim 9 wherein the polycrystalline silicon charge is melted at a rate which has been empirically determined to yield single crystal silicon having a carbon content which is less than that which would be provided if the polycrystalline silicon had not been cleaned.

11. A process as set forth in claim 9 wherein the polycrystalline silicon is melted at a rate of less than 14 kilograms per hour.

12. A process as set forth in claim 9 wherein the polycrystalline silicon is melted at a rate of less than 12 kilograms per hour.

13. A process as set forth in claim 9 wherein the polycrystalline silicon is melted at a rate of less than 10 kilograms per hour.

14. A process as set forth in claim 9 wherein the polycrystalline silicon is melted at a rate of less than 8 kilograms per hour.

15. A process as set forth in claim 9 wherein the oxidizing medium is an oxidizing plasma, an oxidizing gas or an oxidizing liquid.

16. A process as set forth in claim 9 wherein the oxidizing medium is an oxidizing plasma.

17. A process as set forth in claim 9 wherein the oxidizing medium is an oxidizing plasma selected from the group consisting of plasmas formed from a mixture of an inert gas and oxygen; pure oxygen; an inert gas, oxygen and a halogen; an inert gas and a halogen; and pure halogen.

18. A process as set forth in claim 9 wherein the oxidizing medium is a microwave induced oxidizing plasma.

19. A process as set forth in claim 9 wherein the oxidizing medium is a microwave induced oxidizing plasma formed from pure oxygen, a mixture of an inert gas and oxygen, a mixture of an inert gas, oxygen and a halogen, a mixture of an inert gas and a halogen, and pure halogen.

20. A process as set forth in claim 9 wherein the polycrystalline silicon is oxidized in a plasma chamber, the oxidizing medium is a microwave induced oxidizing plasma and the chamber is at a pressure of about 1–3 mm Hg as the polycrystalline silicon is exposed to the oxidizing medium.

21. The process of claim 9 wherein the container is a polyethylene bag.

* * * * *